United States Patent [19]

Namimoto et al.

[11] Patent Number: 5,289,426
[45] Date of Patent: Feb. 22, 1994

[54] DUAL PORT MEMORY HAVING ADDRESS CONVERSION FUNCTION

[75] Inventors: Keiji Namimoto, Yokohama; Hiromasa Hayashi, Kamakura, both of Japan

[73] Assignee: Kabushiki Kaisha Toshiba, Kawasaki, Japan

[21] Appl. No.: 711,800

[22] Filed: Jun. 7, 1991

[30] Foreign Application Priority Data

Jun. 11, 1990 [JP] Japan ............................ 2-149773

[51] Int. Cl.⁵ .............................................. G11C 8/00
[52] U.S. Cl. ............................ 365/230.05; 365/230.08
[58] Field of Search ...................... 365/230.05, 230.08, 365/235, 238.5

[56] References Cited

U.S. PATENT DOCUMENTS

| | | | |
|---|---|---|---|
| 4,590,465 | 5/1986 | Fuchs | 340/723 |
| 4,933,909 | 6/1990 | Cushing et al. | 365/230.05 |
| 5,001,672 | 3/1991 | Ebbers et al. | 365/230.05 |
| 5,095,446 | 3/1992 | Jingu | 365/165 |
| 5,146,572 | 9/1992 | Bailey et al. | 365/230.05 |

Primary Examiner—William L. Sikes
Assistant Examiner—Terry D. Cunningham
Attorney, Agent, or Firm—Foley & Lardner

[57] ABSTRACT

A dual port memory device has two input/output ports. These ports involve address circuits having different coordinate conversion tables. The dual port memory device can quickly respond to access signals prepared on different coordinates and is applicable for graphics processing, etc., which require high-speed memories.

14 Claims, 3 Drawing Sheets

DUAL PORT MEMORY HAVING ADDRESS CONVERSION FUNCTION

BACKGROUND OF THE INVENTION

1. Field of the Invention

The present invention relates to a random access memory, and particularly to a dual port memory having an address conversion function.

2. Description of the Prior Art

As VLSI technology develops, various memory systems have been proposed. One of such memory systems used in the microprocessor technology is a dual port memory which has two data reading/writing systems (ports). For example, a Transputer-type CPU employs two microprocessors connected to a common memory to simultaneously access it to exchange data. This technique is useful in forming a parallel processing system.

The dual port memory has quite different configuration from a single port memory and it has a possibility of being applied for various fields. This possibility, however, has not been developed yet.

SUMMARY OF THE INVENTION

The inventor opened up the possibility of the dual port memory and devised this invention.

An object of the invention is to provide a memory which can handle data according to a plurality of coordinate systems.

Another object of the invention is to provide a high-speed dual port memory.

Still another object of the invention is to provide a high-speed memory which is appropriate for graphics processing.

In order to accomplish the objects, the invention provides a dual port memory comprising a memory array and two ports for writing and reading data to and from the memory array. Each of the ports has an address circuit for outputting an access signal for accessing an address of the memory array, an input/output circuit for sending and receiving data to and from the address of the memory array specified by the address circuit, and a control circuit for controlling the address circuit and input/output circuit. Each of the address circuits of the ports has a function of receiving addressing information based on a different coordinate system and converting the information into an access signal for accessing the memory array.

This dual port memory can handle data at high speed according to a plurality of coordinate systems.

DETAILED DESCRIPTION OF THE EMBODIMENTS

Figure 1:
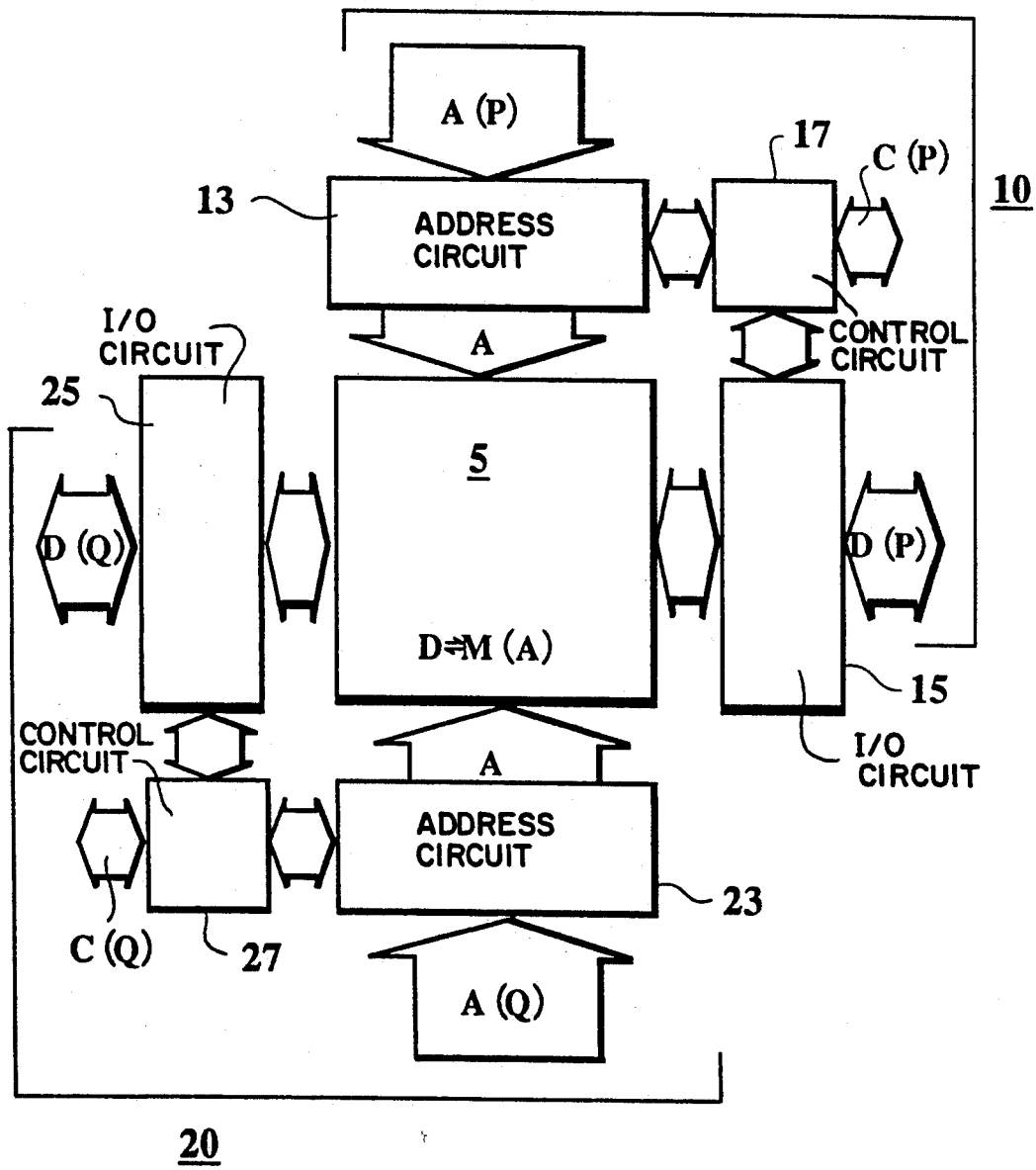
FIG. 1 is a block diagram showing a dual port memory according to a first embodiment of the invention.

FIG. 1 shows a dual port memory according to the first embodiment of the invention. The dual port memory comprises a memory array (RAM) 5 and two ports 10 and 20 for writing and reading data to and from the memory array 5. The port 10 (20) has an address circuit 13 (23) for outputting an access signal A for accessing a physical address in the memory array 5, an input/output circuit 15 (25) for sending and receiving data D(P) to and from an address of the memory array 5 specified by the address circuit 13 (23), and a control circuit 17 (27) for controlling the address circuit 13 (23) and input/output circuit 15 (25) in accordance with control signals C(P) or C(Q). The address circuit 13 (23) of the port 10 (20) receives addressing information A(P) or A(Q) based on different coordinate systems and converts the information into an access signal A for accessing the memory array 5.

The address circuit 13 (23) receives, in addition to the address based on the coordinate system, a signal for specifying coordinate conversion. According to the coordinate conversion specifying signal, a conversion table expressing internal coordinate conversion can be rewritten by the use of the A(P), C(P), D(P) or A(Q), C(Q), D(Q) signals. The address conversion circuit 13(23) may be provided with address conversion functions. PLA, ROM and PROM are simple examples suitable for storing such functions. If such functions are stored in a RAM, the address conversion functions, i.e. corresponding cordinate conversion table, can be rewritten by rewriting the content of the RAM.

Figure 2:
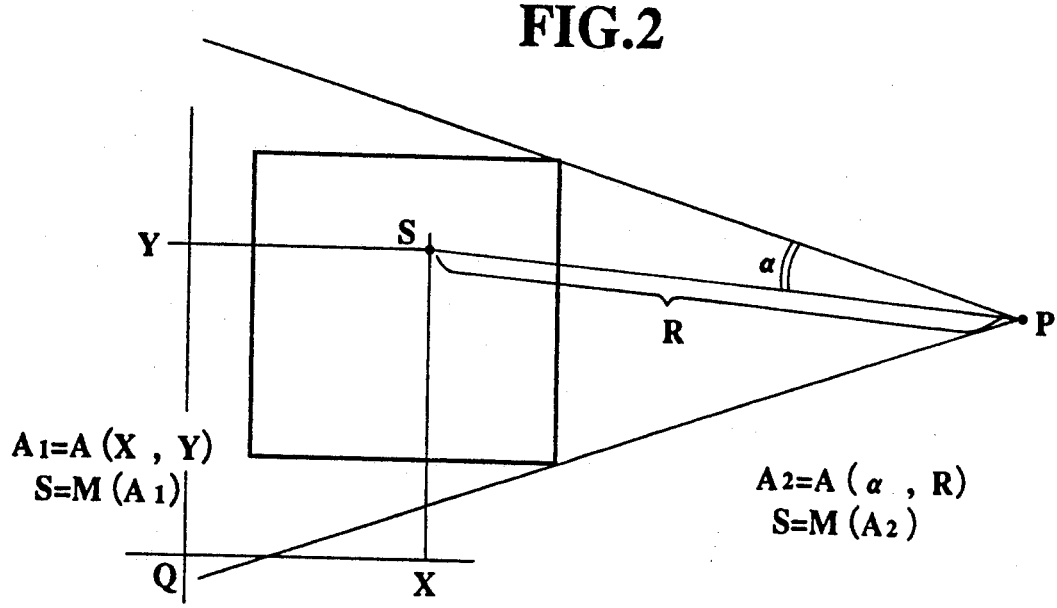
FIGS. 2 and 3 are views showing examples of coordinate systems according to the invention.
Figure 3:
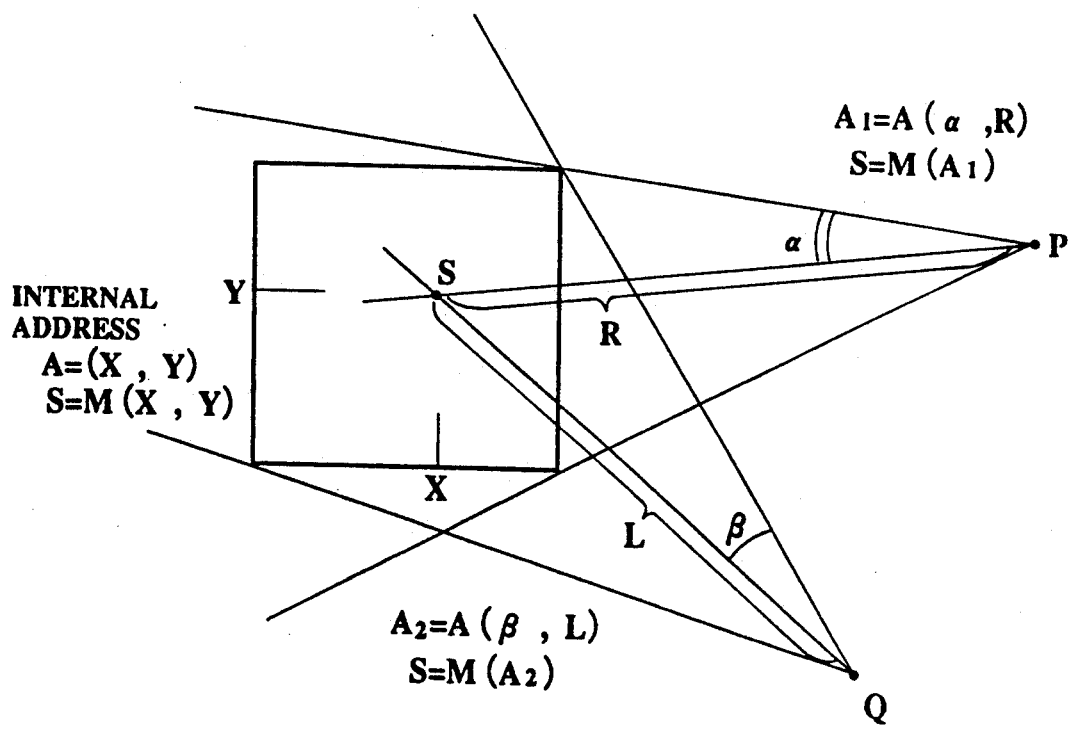

Examples of the coordinate systems of the dual port memory are shown in FIGS. 2 and 3. FIG. 2 shows first and second coordinate systems, i.e., a rectangular coordinate system with an original point Q and a polar coordinate system with an original point P, and FIG. 3 shows first and second coordinate systems, i.e., a polar coordinate system with an original point Q and a polar coordinate system with an original point P.

In any one of the polar coordinate systems, a distance R from the original point to a point to be accessed, and an elongation with respect to a predetermined straight line are given as A(P), which is converted by the address circuit 13 into an internal address A. Generally, an original point may properly be set, and a proper straight or curved line and a rectangular or oblique coordinate system may properly be selected.

Supposing the internal address is A and coordinate variables X and Y, conversion of the first coordinate system will be $A1=f1(X, Y)$ and that of the second coordinate system will be $A2=f2(X, Y)$. In FIGS. 2 and 3, data in the memory array addressed with these addresses is expressed as $S=M(X, Y)$.

Figure 4:
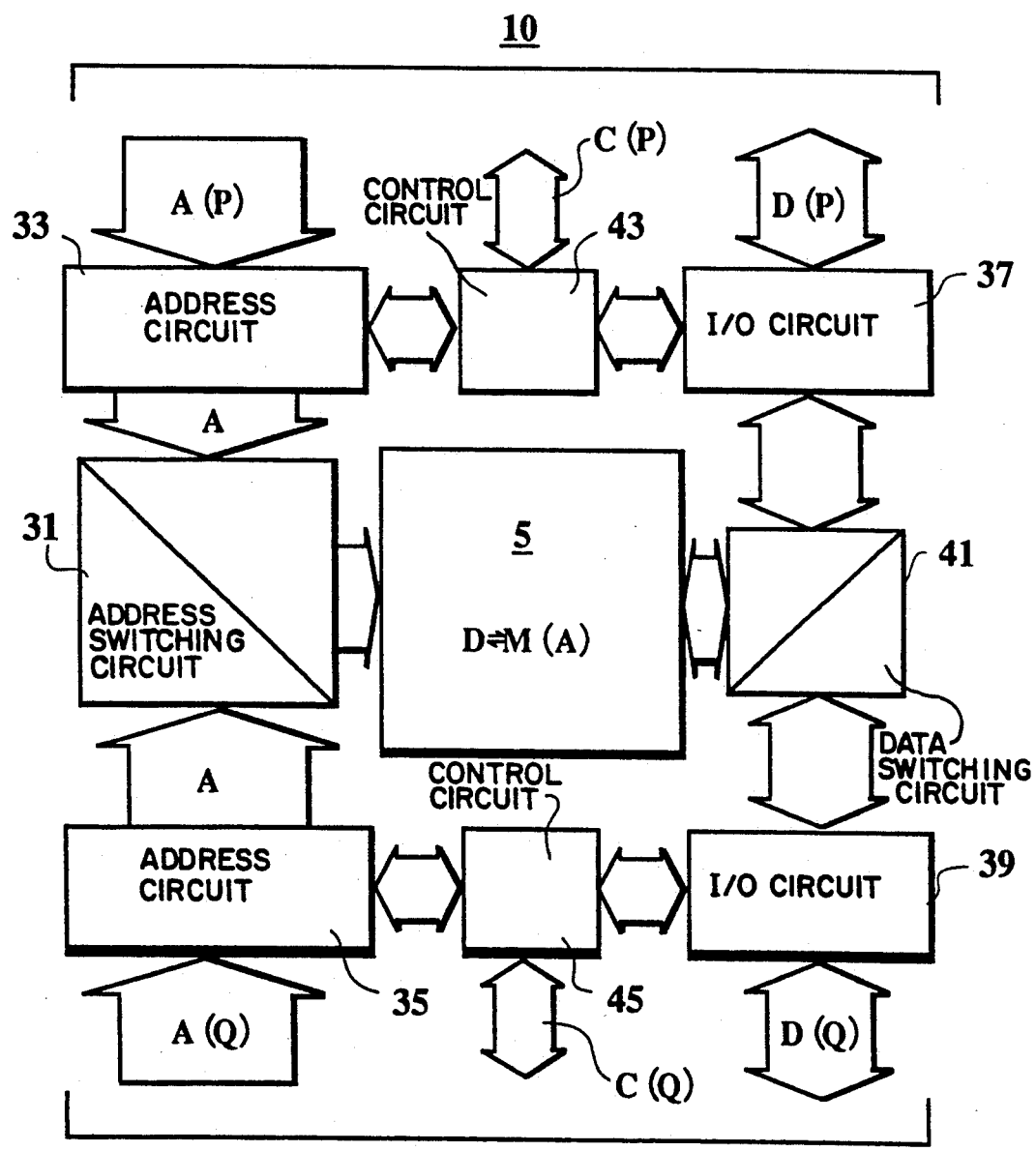
FIG. 4 is a block diagram showing a dual port memory according to a second embodiment of the invention.

FIG. 4 shows the second embodiment of the invention. In this embodiment, an address switching circuit 31 supplies an addressing signal A to a memory array 5. The address switching circuit 31 is connected to a first address circuit 33 and a second address circuit 35, and accesses the memory array 5 according to a signal from one of the address circuits 33 and 35. In this embodiment, two systems (ports) 10 and 20 cannot simultaneously access the memory array 5 but access it in a time-sharing manner. Input/output circuits 37 and 39 are connected to the memory array 5 through a data switching circuit 41 so that data accessed by the first system 10 may be handled by the first system 10, and data accessed by the second system 20 may be handled by the second system 20. Control circuits 43 and 45 are the same as the control circuits 17 and 27 of the first embodiment.

In summary, the present invention provides a dual port memory which can handle data at high speed with use of addresses expressed on a plurality of coordinate systems. When employed for graphics processing, the dual port memory demonstrates a remarkable effect.

Various modifications will become possible for those skilled in the art after receiving the teachings of the present disclosure without departing from the scope thereof.

What is claimed is:

1. A dual port memory comprising:
   a memory array, having a plurality of storing locations for storing data in a two-dimensional array, any storing location of said memory array being accessed by either of first and second inner address signals in accordance with a memory accessing two dimensional coordinate system, respectively responsive to first and second address signals different from each other in accordance with first and second two-dimensional coordinate systems;
   a first address circuit associated with said memory array for receiving said first address signal, said first address signal indicating a first particular storing location in said two-dimensional array in accordance with said first coordinate system, and for converting said first address signal to said first inner address signal to be applied to said memory array in order to access said first particular storing location; and
   a second address circuit associated with said memory array for receiving said second address signal, said second address signal indicating a second particular storing location in said two-dimensional array in accordance with said second coordinate system, and for converting said second address signal to a second inner address signal to be applied to said memory array in order to access said second particular storing location.

2. The dual port memory recited in claim 1, wherein said memory accessing coordinate system is a rectangular coordinate system.

3. The dual port memory recited in claim 2, wherein said second coordinate system is a polar coordinate system.

4. The dual port memory recited in claim 1, including a conversion table in said first address circuit for converting said first address signal to said first inner address signal.

5. The dual port memory recited in claim 4, wherein said conversion table can be rewritten.

6. The dual port memory recited in claim 1, wherein said first and second particular storing locations in said two-dimensional space are the same.

7. The dual port memory recited in claim 1, wherein said first and second particular storing locations in said two-dimensional space are different.

8. A method of accessing data located in a two-dimensional array, the method comprising the steps of:
   storing said data in a memory array having a plurality of storing locations accessible by either of first and second inner address signals in accordance with a memory accessing two dimensional coordinate system, respectively responsive to first and second address signals different from each other in accordance with first and second two-dimensional coordinate systems;
   wherein accessing said data with said first address signal comprises the steps of:
      receiving said first address signal in a first address circuit associated with said memory array, said first address signal indicating a first particular storing location in said two-dimensional array in accordance with said first coordinate system;
      converting said first address signal to said first inner address signal;
      applying said first inner address signal to said memory array in order to access said first particular storing location; and
   wherein accessing said data with said second address signal comprises the steps of:
      receiving said second address signal in a second address circuit associated with said memory array, said second address signal indicating a second particular storing location in said two-dimensional array in accordance with said second cordinate system;
      converting said second address signal to a second inner address signal; and
      applying said second inner address signal to said memory array in order to access said second particular storing location.

9. The method recited in claim 8, wherein said memory accessing coordinate system is a rectangular coordinate system.

10. The method recited in claim 9, wherein said second coordinate system is a polar coordinate system.

11. The method recited in claim 8, including the step of converting said first address signal to said first inner address signal in a conversion table in said first address circuit.

12. The method recited in claim 11, including the step of rewriting said conversion table.

13. The method recited in claim 8, wherein said first and second particular storing locations in said two-dimensional array are the same.

14. The method recited in claim 8, wherein said first and second particular storing locations in said two-dimensional array are different.

* * * * *